(12) United States Patent
Payne et al.

(10) Patent No.: US 8,269,528 B2
(45) Date of Patent: Sep. 18, 2012

(54) TIMING SKEW ERROR CORRECTION APPARATUS AND METHODS

(75) Inventors: Robert Floyd Payne, Lucas, TX (US); Philip M. Pratt, McKinney, TX (US); William David Smith, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 119 days.

(21) Appl. No.: 12/948,757

(22) Filed: Nov. 18, 2010

(65) Prior Publication Data

US 2012/0126869 A1    May 24, 2012

(51) Int. Cl.
G11C 27/02    (2006.01)
(52) U.S. Cl. .......................... 327/94; 341/122
(58) Field of Classification Search ........... 327/91–96; 341/122–125
See application file for complete search history.

(56) References Cited

U.S. PATENT DOCUMENTS

| | | | | |
|---|---|---|---|---|
| 3,657,653 A | * | 4/1972 | Wilkinson | 375/246 |
| 4,573,033 A | * | 2/1986 | Kolodin | 341/122 |
| 5,402,019 A | * | 3/1995 | Drummond et al. | 327/237 |
| 5,812,626 A | * | 9/1998 | Kusumoto et al. | 377/20 |
| 6,763,057 B1 | * | 7/2004 | Fullerton et al. | 375/141 |
| 7,164,631 B2 | * | 1/2007 | Tateishi et al. | 369/44.34 |
| 7,808,408 B2 | | 10/2010 | Madisetti et al. | |
| 2001/0050624 A1 | * | 12/2001 | Nagaraj | 341/122 |
| 2003/0227841 A1 | * | 12/2003 | Tateishi et al. | 369/44.34 |

* cited by examiner

*Primary Examiner* — Lincoln Donovan
*Assistant Examiner* — William Hernandez
(74) *Attorney, Agent, or Firm* — John J. Patti; Wade J. Brady, III; Frederick J. Telecky, Jr.

(57) ABSTRACT

Apparatus and methods disclosed herein operate to compensate for skew between inverse phases (e.g., differential phases) of an analog signal appearing at the inputs of an analog signal capture circuit such as a track-and-hold or sample-and-hold circuit associated with an ADC or similar device. Each of two capture clocks is used to capture one of the inverse phases. One or more delay circuits are configured to create a differential delay between clock transitions associated with the two capture clocks. The differential delay is proportional to the input skew between the inverse phases. The phases are consequently sampled at substantially identical points on a phase domain axis. Embodiments operate to create phase sampling synchronicity and to thereby decrease the amplitude of a common-mode signal component that results from the skew. Increased linearity and decreased distortion may result.

19 Claims, 6 Drawing Sheets

TIMING SKEW ERROR CORRECTION APPARATUS AND METHODS

TECHNICAL FIELD

Embodiments described herein relate to apparatus and methods associated with analog-to-digital converters, including structures and techniques related to analog input timing skew error correction.

BACKGROUND INFORMATION

Analog-to-digital converters (ADCs) typically include one or more sample-and-hold or track-and-hold (T/H) input circuits. The term T/H shall hereinafter refer to either or both sample-and-hold or T/H circuits. A T/H input stage captures the magnitude of an analog signal at a sample time and maintains the sampled amplitude for subsequent quantization and processing.

Some ADCs, including ADCs with fully differential and/or pseudo-differential inputs, may utilize two T/H circuits to capture an analog signal. One T/H circuit captures a (+) phase of the signal and a second, independent T/H circuit captures the (−) phase of the signal.

In the latter case, it is difficult to perfectly match the input impedances of the two T/H circuits. One result of presenting a different input impedance to each input phase is that the resulting composite held signal contains both common-mode and differential signal components. A difference in the input impedances results in imperfect common-mode rejection (CMR). The common-mode component may negatively impact the integrity of the held signal, leading to non-linearity and distortion.

The impact of the mismatch in input impedances increases with increasing frequency, as does the common-mode component of the held signal. Consequently, the problem of decreased CMR resulting from independent T/H inputs may be particularly acute for certain high sampling rate, high frequency applications requiring high levels of linearity.

Another contributor to the common-mode signal on the held inputs is the delay skew between signals appearing on lines of the input differential pair. The delay skew results from path-length differences associated with the separate T/H circuits and associated circuit paths. A result of the input signals not being time-aligned is that the common-mode of the two signals is non-zero and includes the signal itself.

Thus, the amplitude of the common-mode signal relative to the differential signal is a function of the frequency of the analog inputs and the delay skew between the (+) and (−) analog inputs. Higher frequency and/or greater skew result in an increase in common-mode amplitude, a decrease in the apparent amplitude of the differential signal, and a loss of signal-to-noise ratio (SNR).

Existing methods address the problem by attempting to match the delay between the (+) and (−) analog input signals or by changing the delay of the (+) and (−) signals relative to one another. One such method is to use two transformers in a back-to-back relationship in order to improve delay matching of the (+) and (−) analog inputs. Another technique is to use a programmable low-pass filter in series with each (+) and (−) analog input. Input signal delays may be independently tuned by adjusting the time constant of each filter independently. Similarly, wide bandwidth all-pass filters may be used to tune input delays. An alternative technique is to design a system substrate with selectable trace lengths, each having a slightly different propagation delay. A set of trace paths resulting in a reduced differential propagation delay may then be selected.

SUMMARY OF THE INVENTION

Embodiments herein operate to compensate for timing skew between inverse phases (e.g., differential phases) of an analog signal appearing at the input to an analog capture circuit such as a track-and-hold or sample-and-hold circuit associated with an ADC or similar device. Each of two capture clocks is used to capture one of the phases. One or more delay circuits are configured to create a differential delay between clock transitions associated with the two capture clocks. The differential delay is proportional to the skew, if any, between the inverse phases. As a result, the phases are effectively sampled at substantially identical points on a phase axis associated with the two phases. This process is referred to hereinafter as "phase sampling alignment." Embodiments operate to sample-align the two phases and to thereby decrease a common-mode signal component resulting from the phase misalignment condition.

DETAILED DESCRIPTION

Figure 1A:
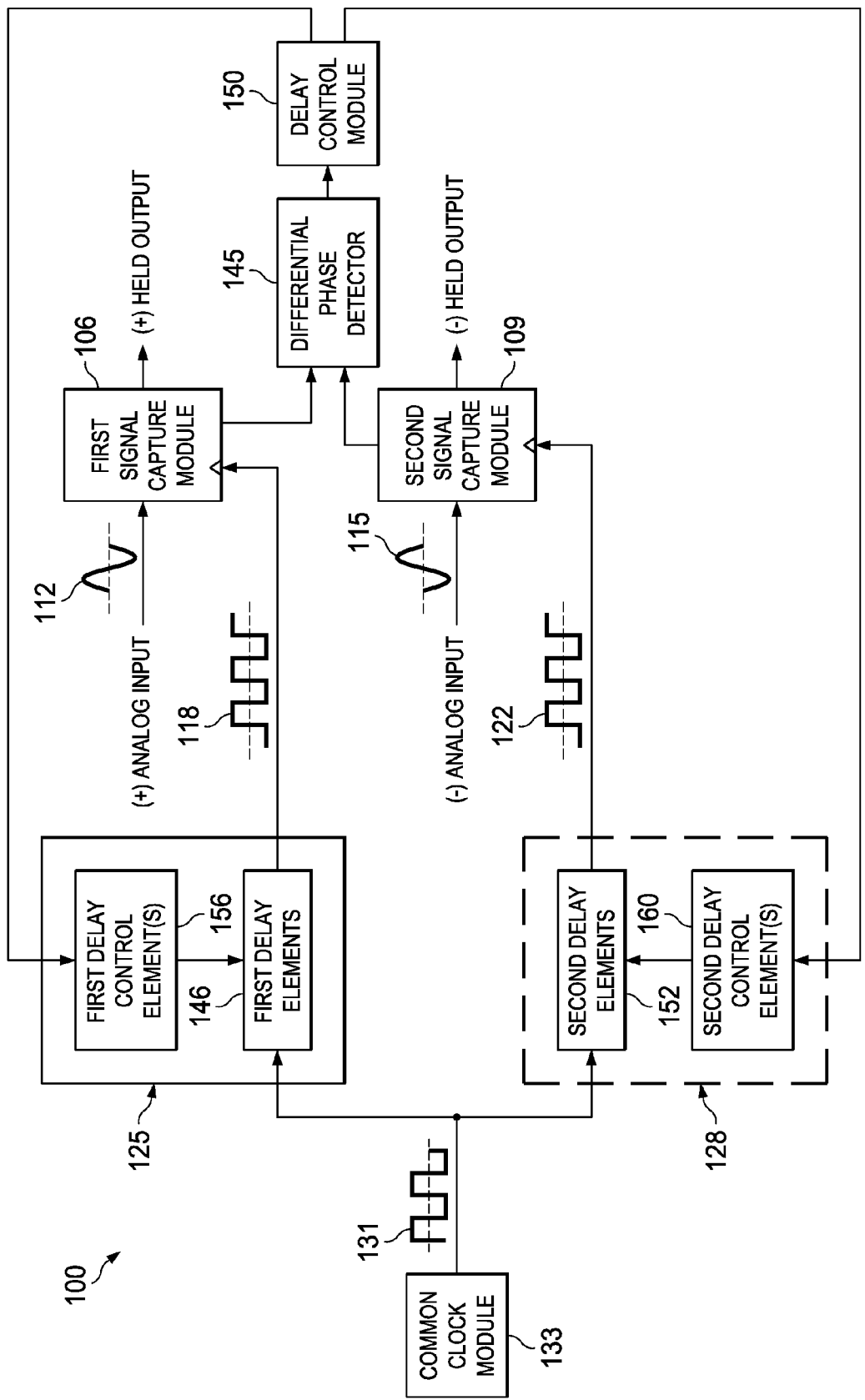
FIG. 1A is a block diagram of a dual-clocked analog signal sampling circuit according to various example embodiments of the current invention.

FIG. 1A is a block diagram of a dual-clocked analog signal sampling circuit 100 according to various example embodiments of the current invention. The sampling circuit 100 includes first and second signal capture modules 106 and 109. In some embodiments, the first and second signal capture modules 106 and 109 comprise track-and-hold circuits, sample-and-hold circuits, or both. Although example embodiments may be described in the context of track-and-hold circuits associated with ADC architectures, contemplated embodiments may apply to other types of circuits and applications.

The first and second signal capture modules 106 and 109 operate to sample a first phase 112 and a second phase 115, respectively, of an analog input signal. The first and second phases 112 and 115 may be inverse phases (e.g., differential phases). The first phase 112 is sampled by capturing the magnitude of the first phase 112 at the first signal capture module 106 upon receipt of a clock transition from a first capture clock 118. The second phase 115 is sampled by capturing the magnitude of the second phase 115 at the second signal capture module 109 upon receipt of a clock transition from a second capture clock 122.

The sampling circuit 100 also includes a first clock delay module 125 coupled to the first signal capture module 106. An optional second clock delay module 128 is coupled to the second signal capture module 109. The clock delay modules 125 and/or 128 operate to create a differential delay between clock transitions from the first and second capture clocks 118 and 122. The differential delay is proportional to a time difference between the first phase 112 and the second phase 115 as received at the inputs of the first and second signal capture modules 106 and 109, respectively.

Given that the desired compensative delay is differential as between the first phase 112 and the second phase 115, the delay may, in some embodiments, be created using a single clock delay module. Therefore, although example embodiments may be described as including two clock delay modules, similar embodiments utilizing a single clock delay module are contemplated and incorporated herein.

A common clock 131 is generated by a common clock module 133. The first clock delay module 125 delays the common clock 131 by a first delay period to generate the first capture clock 118. The second clock delay module 128 delays the common clock 131 by a second delay period to generate the second capture clock 122. The clock delay modules 125 and 128 may be configured to establish the first delay period, the second delay period, or both. In some embodiments, the first and/or second delay periods may be equal to zero.

Figure 1B:
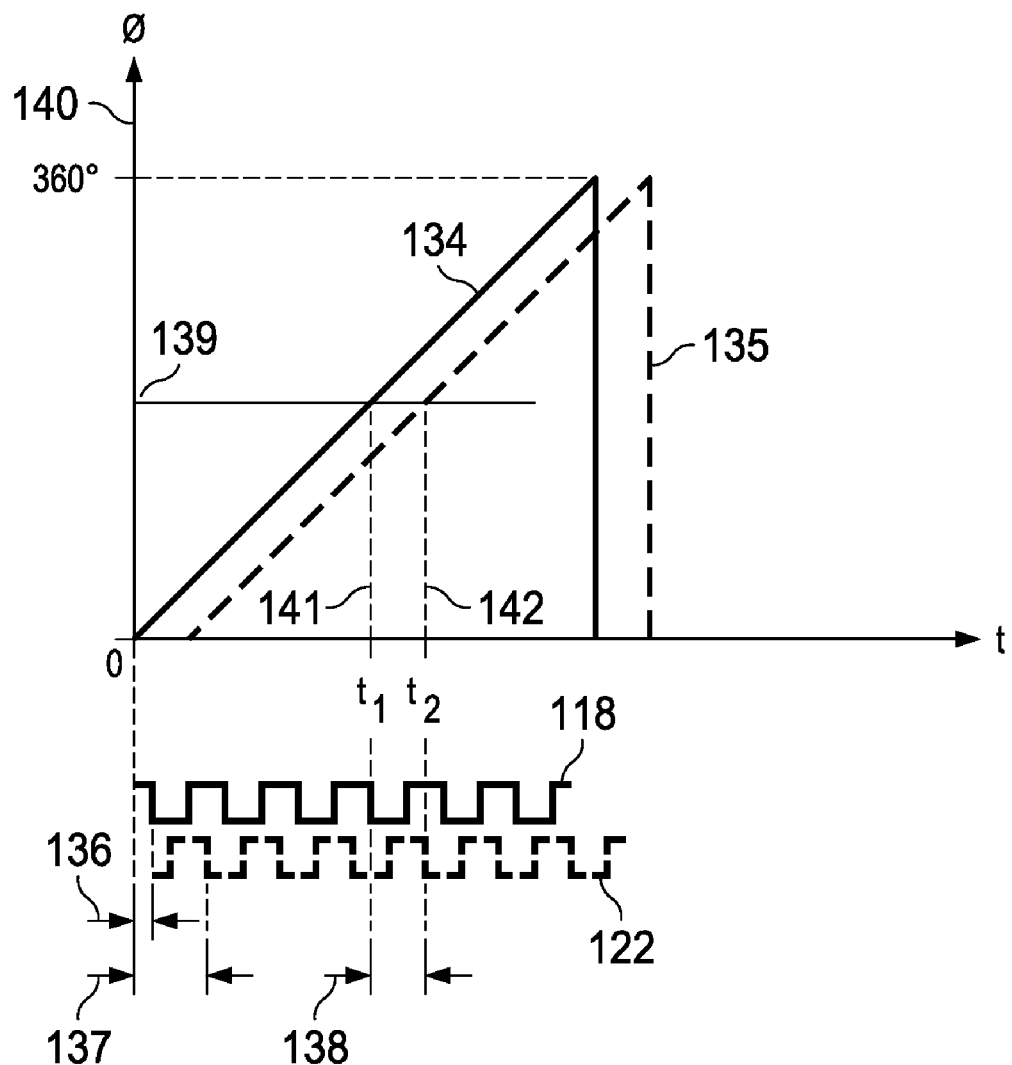
FIG. 1B is a phase diagram showing analog phase sampling alignment according to various example embodiments.

FIG. 1B is a phase diagram showing analog phase sampling alignment according to various example embodiments. Phase plots 134 and 135 correspond to the first and second phases 112 and 115, respectively, of FIG. 1A. The above-described first and second delay period(s) 136 and 137 correspond to the first and second capture clocks 118 and 122, respectively. The delay periods 136 and 137 are established to create the differential delay 138. The differential delay 138 causes the first phase 112 and second phase 115 to be sampled at a substantially identical point 139 on a phase axis 140 at times 141 (t1) and 142 (t2), respectively.

Turning back to FIG. 1A, the first and second clock delay modules 125 and 128 may include first and second delay elements 146 and 152, respectively. The first and second delay elements 146 and 152 are coupled to the first and second signal capture modules 106 and 109, respectively, and to the common clock module 133. In some embodiments, the first delay element 146, the second delay element 152, or both, may comprise one or more inverters, delay lines, or other circuit elements capable of adjusting propagation delay. It is noted that "propagation delay" in this context means any clock adjustment, in positive or negative amounts, which operates to establish or modify the differential delay 138.

The first and second clock delay modules 125 and 128 may also include first and second delay control elements 156 and 160 coupled to the first and second delay elements 146 and 152, respectively. The first and second delay control elements 156 and 160 set the magnitude of one or more delay control parameters. The delay control parameters act upon the delay elements 146 and 152 to establish the first and second delay periods 136 and 137. Control parameters may include delay element power supply voltage, load capacitance, and tuning current as illustrated in various example embodiments further described below. Other delay control parameters are possible and are contemplated and incorporated herein.

Delay control parameter values may be fixed at the time of circuit fabrication or manufacturing test, or may be variable. Some embodiments may include feedback loops to provide for continuous adjustment of control parameter values. The delay control parameter values are selected to adjust the first delay period, the second delay period, or both in order to maintain phase domain sampling synchronicity between the first phase 112 and the second phase 115.

Figure 2:
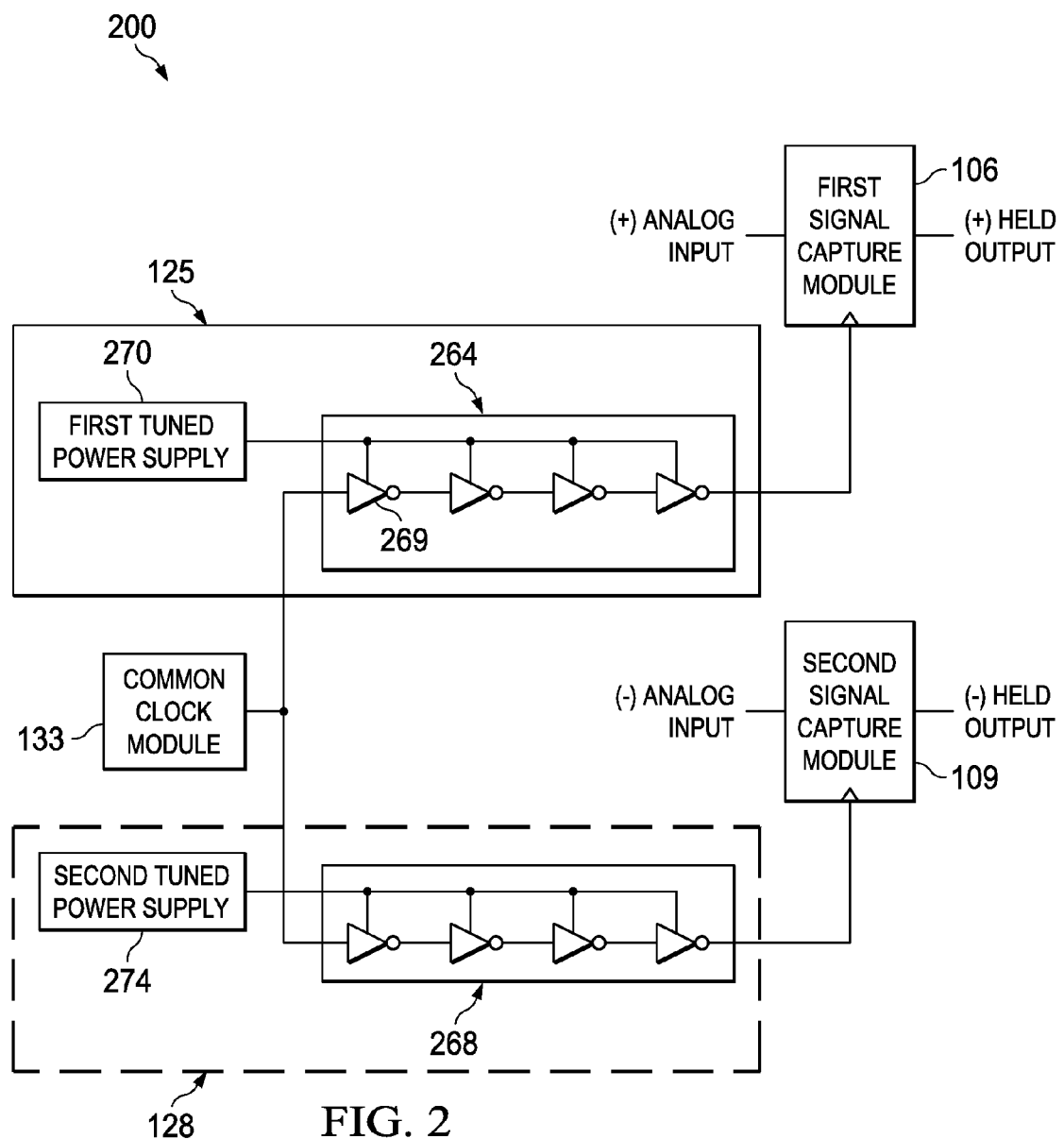
FIG. 2 is a block diagram of a supply voltage dependent phase-adjusted analog signal sampling circuit according to various example embodiments.

FIG. 2 is a block diagram of a supply voltage dependent phase-adjusted analog signal sampling circuit 200 according to various example embodiments. The sampling circuit 200 includes one or more sets of voltage dependent delay elements 264 and 268 coupled to a common clock module 133. Each set of delay elements 264, 268 includes one or more delay element members (e.g., the example delay element 269). The sets of delay elements 264 and 268 are also coupled to the first and second signal capture modules 106 and 109, respectively. The sets of delay elements 264 and 268 operate on a clock signal from the common clock 133 to create a differential delay between the capture clocks 118 and 122 appearing at the first and second signal capture modules 106 and 109, respectively.

In an example embodiment, the analog sampling circuit 200 also includes first and second power supplies 270 and 274 coupled to the sets of delay elements 264 and 268. The power supplies 270, 274 and the sets of delay elements 264, 268 are components of the clock delay modules 125 and 128 described above and illustrated at FIG. 1A. The power supplies 270 and 274 provide supply voltages to the sets of delay elements 264 and 268. The supply voltages act upon delay element members of the sets of delay elements 264 and 268 to control the amount of propagation delay provided by the delay elements.

In some embodiments, the first and second power supplies 270 and 274 may be voltage-variable power supplies. Some embodiments may include more than two power supplies. Additional power supplies may enable independent delay control to an individual delay element such as the example delay element 269. It is also noted that the term "power supply" as used herein may include any delay element supply voltage-providing circuit, including a voltage divider circuit.

The power supplies 270 and 274 are selected and/or adjusted to set one or more voltage levels in order to control an amount of propagation delay associated with one or more of the delay elements included in the sets of delay elements 264 and 268. Propagation delay(s) are set to establish positions on a time axis of the first and second capture clocks 118 and 122 such that the first phase 112 and second phase 115 illustrated at FIG. 1A are sampled at substantially identical points on the phase axis 140 associated with the analog signal, as illustrated at FIG. 1B.

Figure 3:
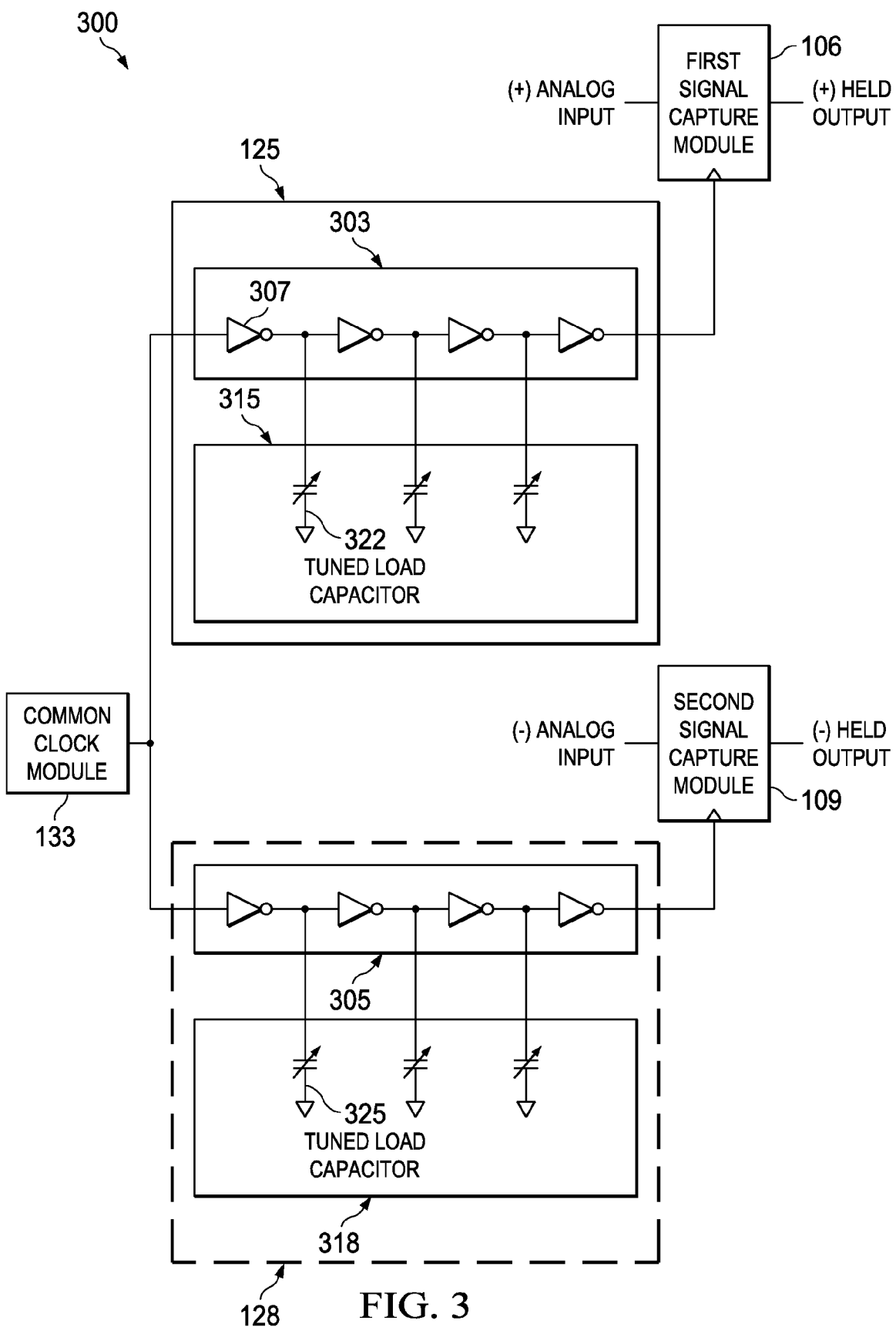
FIG. 3 is a block diagram of a capacitive load dependent phase-adjusted analog signal sampling circuit according to various example embodiments.

FIG. 3 is a block diagram of a capacitive load dependent phase-adjusted analog signal sampling circuit 300 according to various example embodiments. The sampling circuit 300 includes two sets of load capacitance dependent delay elements 303 and 305 coupled to a common clock module 133, each set comprising one or more delay element members (e.g., the example delay element 307). The sets of delay elements 303 and 305 are also coupled to the first and second signal capture modules 106 and 109, respectively.

The analog sampling circuit 300 also includes two sets of tuned load capacitors 315 and 318 (e.g., the capacitors 322 and 325). In some embodiments, each tuned load capacitor is coupled to the output of one or more of the load capacitance dependent delay elements included in the sets of delay elements 303 and 305. The sets of capacitors 315, 318 and the sets of delay elements 303, 305 are components of the clock delay modules 125 and 128 illustrated at FIG. 1A.

Although FIG. 3 shows a separate capacitor (e.g., the capacitor 322) coupled to the output of each of the delay elements, it is noted that some embodiments may be implemented using a single capacitor to provide delay control capacitance distributed across multiple delay elements. And, some embodiments may employ a delay control capacitance for certain delay elements and not for others. In some embodiments, the sets of tuned load capacitors 315 and 318 may comprise variable capacitors.

The tuned load capacitors in the sets 315 and 318 are selected and/or adjusted to set one or more capacitance values in order to control an amount of propagation delay associated with one or more of the delay elements included in the sets of delay elements 303 and 305. Propagation delay(s) are set to establish positions on a time axis of the first and second capture clocks 118 and 122 such that the first phase 112 and second phase 115 illustrated at FIG. 1A are sampled at substantially identical points on the phase axis 140 associated with the analog signal, as illustrated at FIG. 1B.

Figure 4:
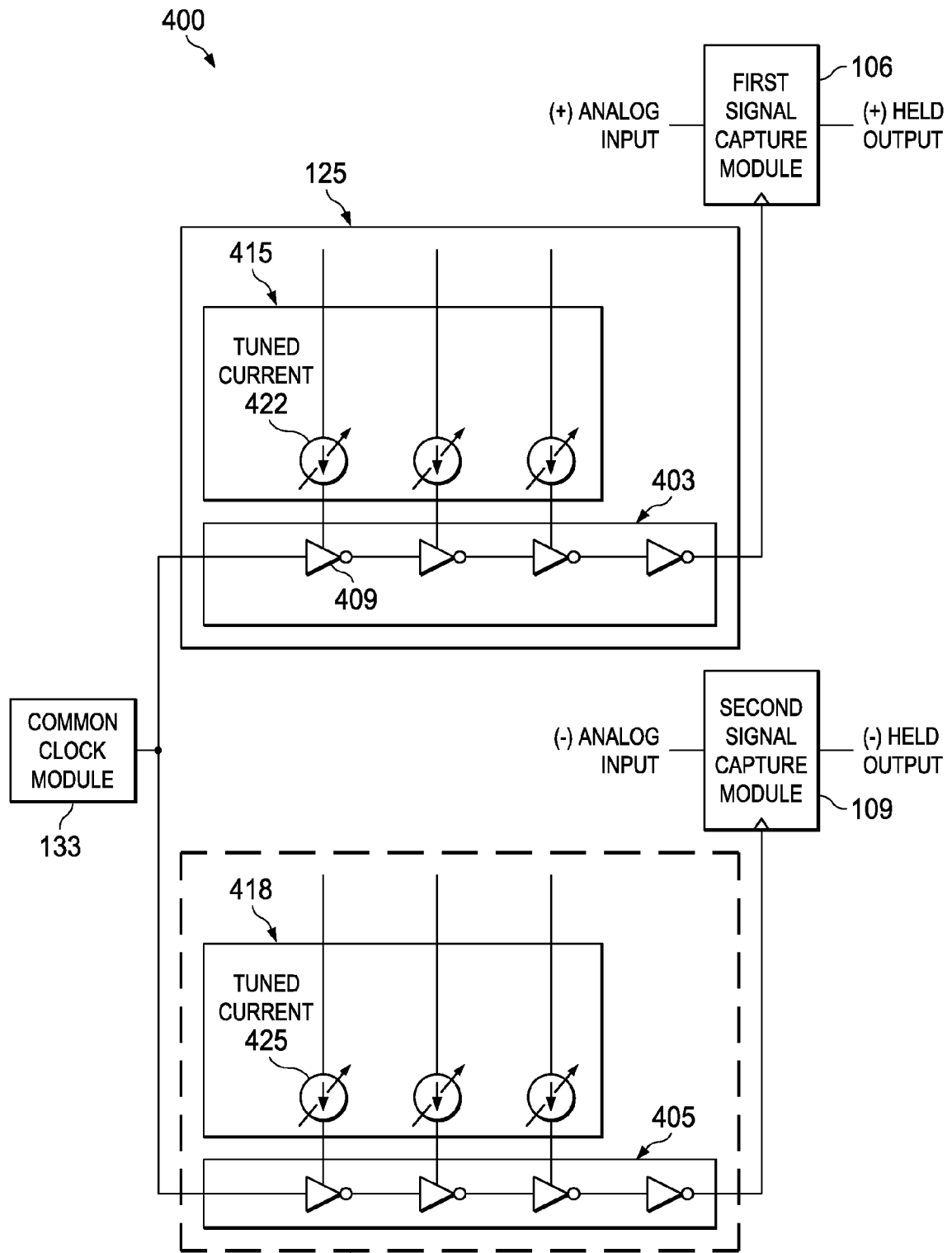
FIG. 4 is a block diagram of a current starved phase-adjusted analog signal sampling circuit according to various example embodiments.

FIG. 4 is a block diagram of a current starved phase-adjusted analog signal sampling circuit 400 according to various example embodiments. The sampling circuit 400 includes two sets of current-starved delay elements 403 and 405 coupled to a common clock module 133. Each of the sets of current-starved delay elements 403 and 405 may include one or more delay element members (e.g., the example delay element 409). The sets of delay elements 403 and 405 are also coupled to the first and second signal capture modules 106 and 109, respectively.

The analog sampling circuit 400 also includes two sets of tuned current sources 415 and 418 (e.g., the current sources 422 and 425). In some embodiments, each tuned current source is coupled to one of the current-starved delay elements comprising the sets of delay elements 403 and 405. The sets of current sources 415, 418 and the sets of delay elements 403, 405 are components of the clock delay modules 125 and 128 illustrated at FIG. 1A.

Although FIG. 4 shows a separate tuned current source (e.g., the current source 422) coupled to each of the delay elements, it is noted that some embodiments may employ a tuned current source for certain delay elements and not for others. In some embodiments, the current sources in the sets of current sources 415 and 418 may be variable.

The tuned current sources in the sets 415 and 418 are selected and/or adjusted to set the magnitudes of one or more control currents in order to control an amount of propagation delay associated with one or more of the delay elements included in the sets of delay elements 403 and 405. Propagation delay(s) are set to establish positions on a time axis of the first and second capture clocks 118 and 122 such that the first phase 112 and second phase 115 illustrated at FIG. 1A are sampled at substantially identical points on the phase axis 140 associated with the analog signal, as illustrated at FIG. 1B.

Turning back to FIG. 1, the dual-clocked analog signal sampling circuit 100 may also include a differential phase detector 145 coupled to the first signal capture module 106 and to the second signal capture module 109. The differential phase detector 145 determines a phase difference between the first phase 112 and the second phase 115.

The sampling circuit 100 may also include a delay control module 150 coupled to the differential phase detector 145. The delay control module 150 may also be coupled to the first clock delay module 125, the second clock delay module 128, or both. The delay control module 150 acts upon the first and/or second delay control elements 156 and 160 to effect adjustments of the first and/or second delay periods 136, 137 illustrated at FIG. 1B. The delay periods 136 and/or 137 are adjusted in an amount proportional to the phase difference such that the first phase 112 and the second phase 115 are sampled at substantially identical points on the phase axis 140.

The sampling circuits 100, 200, 300, 400; the signal capture modules 106, 109; the phases 112, 115; the clocks 118, 122, 131; the delay modules 125, 128; the phase plots 134, 135; the delay period(s) 136, 137, 138; the point 139; the axis 140; the times 141, 142; the delay elements 146, 152, 264, 268, 269, 303, 305, 307, 403, 405, 409; the control elements 156, 160; the power supplies 270, 274; the load capacitors 315, 318, 322, 325; the current sources 415, 418, 422, 425; the phase detector 145; and the control module 150 may all be characterized as "modules" herein.

The modules may include hardware circuitry, optical components, single or multi-processor circuits, memory circuits, and/or computer instructions encoded in a computer-readable medium and capable of being executed by a processor (excluding non-functional descriptive matter), firmware, and combinations thereof, as desired by the architect of the dual-clocked analog signal sampling circuits 100, 200, 300, and 400 and as appropriate for particular implementations of various embodiments.

The apparatus and systems described herein may be useful in applications other than ADC converters. Examples of the dual-clocked analog signal sampling circuits 100, 200, 300, and 400 herein are intended to provide a general understanding of the structures of various embodiments. They are not intended to serve as complete descriptions of all the elements and features of apparatus and systems that might make use of these structures.

The various embodiments may be incorporated into electronic circuitry used in computers, communication and signal processing circuitry, single-processor or multi-processor modules, single or multiple embedded processors, multi-core processors, data switches, and application-specific modules including multilayer, multi-chip modules, among others. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others. Some embodiments may also include one or more methods.

Figure 5:
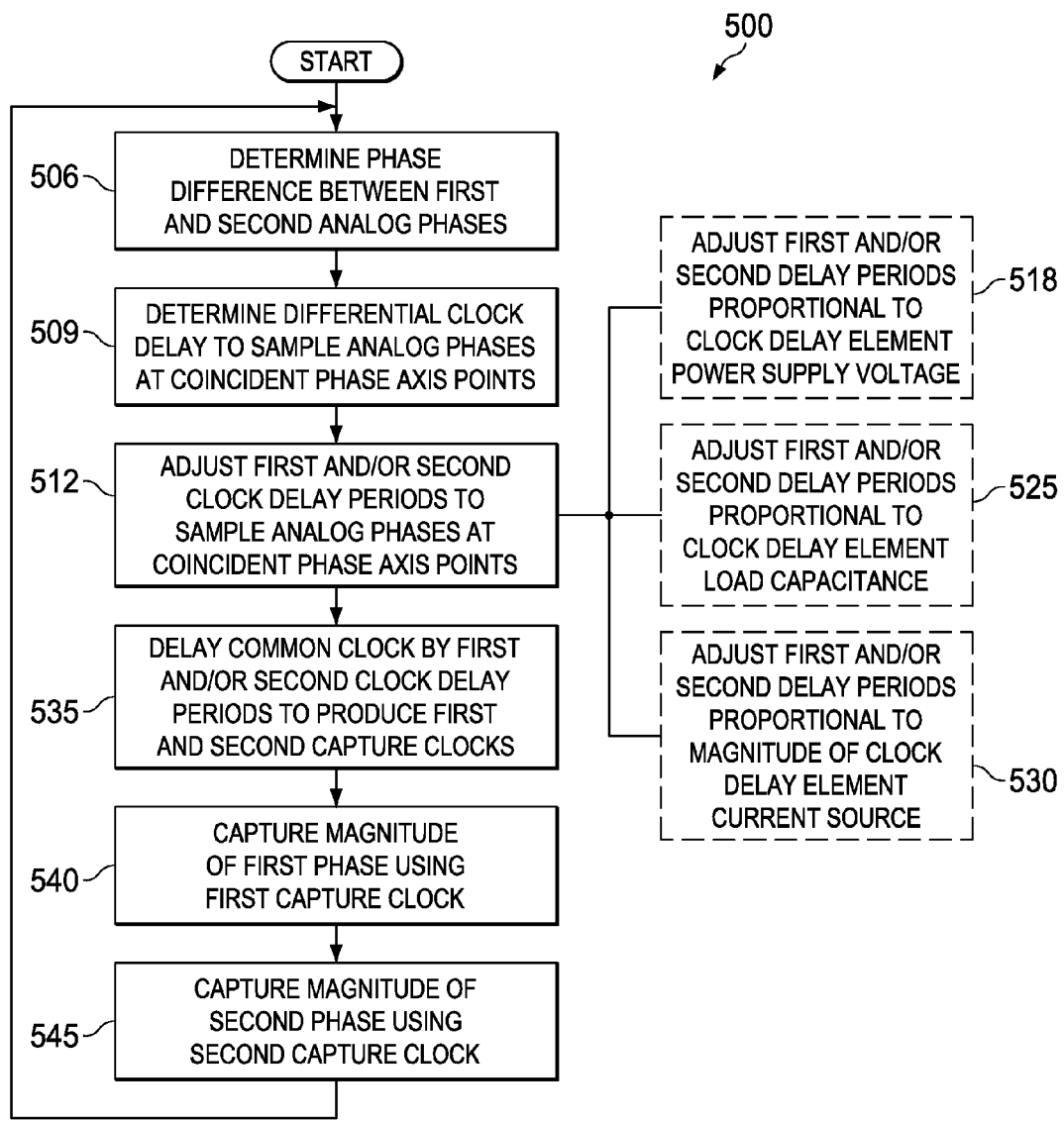
FIG. 5 is a flow diagram illustrating an example method according to various embodiments.

FIG. 5 is a flow diagram illustrating an example method 500 according to various embodiments. The method 500 operates to create a differential delay between clock transitions associated with first and second capture clocks. Each of the two capture clocks is used to sample one of two inverse phases (e.g., differential phases; also referred to herein as "first phase" and "second phase") of an analog input signal at an input to an ADC or similar device. Each of the phases is sampled by capturing a magnitude of the phase upon receipt of the corresponding capture clock.

The differential delay is set/adjusted in proportion to a time difference, if any, between the phases as received at the inputs to an analog signal capture module such as a track-and-hold or sample-and-hold circuit. The method 500 operates to align the first and second phases in the phase domain (as illustrated in FIG. 1B and as previously described) and to thereby decrease a common-mode signal component resulting from any phase misalignment condition.

The method 500 commences at block 506 with determining a phase difference between first and second phases of the analog signal. The method 500 continues with determining a differential clock delay period proportional to the phase difference, at block 509.

The method 500 continues at block 512 with adjusting a first clock delay period, a second clock delay period, or both, in proportion to the differential clock delay period. The goal of these adjustments is to cause the first and second phases to be sampled at substantially identical points on a phase axis associated with the analog signal, as illustrated at FIG. 1B. The clock delay periods may be adjusted in amounts proportional to one or more delay-determining parameter values.

In some embodiments, the method 500 operates in a closed loop to dynamically determine the phase difference between the first and second phases. In the latter case, the method 500 attempts to continuously maintain a proportional relationship between the clock delay adjustment amount(s) and the phase difference. In alternate embodiments, the method 500 may operate open-loop. In the latter case, the delay adjustment amounts may be determined at design time, at manufacturing test time, or at some other time thereafter.

In some embodiments, for example, the method 500 may include adjusting one or both clock delay periods using power supply voltages, at block 518. Supply voltages to one or more clock delay elements may be selected. A delay period associated with a delay element may be adjusted in an amount proportional to the supply voltage. The method 500 may alternatively include adjusting the first and/or second delay periods in amounts proportional to load capacitances associated with the outputs of one or more clock delay elements, at block 525. According to another example embodiment, the method 500 may include adjusting the first and/or second delay periods in amounts proportional to current sources associated with one or more current-starved clock delay elements, at block 530.

The method 500 continues with delaying the common clock by the first and/or second delay periods to produce the first and second capture clocks, at block 535. The first delay period, the second delay period, or both may be set equal to zero, as previously mentioned. For example, if the first and second phases are not time-delayed relative to each other as received at the inputs of the ADC or similar device, both delay periods may be set equal to zero. Some embodiments may adjust both first and second delay periods to achieve an appropriate differential delay between the first and second capture clocks. Some embodiments may adjust one or the other but not both delay periods.

The method 500 continues at block 540 with sampling the first phase by capturing the magnitude of the first phase upon receipt of a clock transition from the first capture clock. The method 500 may also include sampling the second phase by capturing the magnitude of the second phase upon receipt of a clock transition from the second capture clock, at block 545. The method 500 may continue in a loop at block 506 for the closed-loop case or at block 512 for the open-loop case.

It is noted that the activities described herein may be executed in an order other than the order described. The various activities described with respect to the methods identified herein may also be executed in repetitive, serial, and/or parallel fashion.

The apparatus and methods described herein operate to sample two phases of an analog signal at substantially identical phase-axis points as received at the inputs of two separately-clocked analog signal capture devices. A decreased common-mode signal component and a consequent increase in linearity and decreased distortion may result.

By way of illustration and not of limitation, the accompanying figures show specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense. The breadth of various embodiments is defined by the appended claims and the full range of equivalents to which such claims are entitled.

Such embodiments of the inventive subject matter may be referred to herein individually or collectively by the term "invention" merely for convenience and without intending to voluntarily limit this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the preceding Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. An analog signal sampling circuit, comprising:
   a first signal capture module to sample a first phase of an analog signal by capturing a magnitude of the first phase upon receipt of a clock transition from a first capture clock;
   a first clock delay module coupled to the first signal capture module to delay a common clock by a first delay period to generate the first capture clock;
   a second signal capture module to sample a second phase of the analog signal by capturing a magnitude of the second phase upon receipt of a clock transition from a second capture clock; and
   a second clock delay module coupled to the common clock and to the second signal capture module to delay the common clock by a second delay period to generate the second capture clock.

2. The sampling circuit of claim 1, the first clock delay module and the second clock delay module configured to establish at least one of the first delay period or the second delay period such that the first phase and second phase are sampled at substantially identical points on a phase axis associated with the analog signal.

3. The sampling circuit of claim 1, at least one of the first signal capture module or the second signal capture module comprising at least one of a track-and-hold circuit or a sample-and-hold circuit.

4. The sampling circuit of claim 1, at least one of the first clock delay module or the second clock delay module further comprising:
   at least one delay element; and
   at least one delay control element coupled to the delay element to establish at least one of the first delay period or the second delay period.

5. The sampling circuit of claim 4, the delay element comprising an inverter.

6. The sampling circuit of claim 4, further comprising:
a differential phase detector coupled to the first signal capture module and to the second signal capture module to determine a phase difference between the first phase and the second phase; and
a delay control module coupled to the differential phase detector to act upon the delay control element to adjust at least one of the first delay period or the second delay period in an amount proportional to the phase difference such that the first phase and second phase are sampled at substantially identical points on a phase axis associated with the analog signal.

7. The sampling circuit of claim 1, at least one of the first clock delay module or the second clock delay module further comprising:
at least one supply voltage dependent delay element; and
a power supply coupled to the supply voltage dependent delay element to set a voltage level to control an amount of propagation delay associated with the supply voltage dependent delay element and to establish a position on a time axis of at least one of the first capture clock or the second capture clock such that the first phase and the second phase are sampled at substantially identical points on a phase axis associated with the analog signal.

8. The sampling circuit of claim 7, the power supply comprising a voltage-variable power supply.

9. The sampling circuit of claim 1, at least one of the first clock delay module or the second clock delay module further comprising:
at least one load capacitance dependent delay element; and
a tuned load capacitor coupled to the output of the load capacitance dependent delay element to set an amount of propagation delay associated with the load capacitance dependent delay element and to establish a position on a time axis of at least one of the first capture clock or the second capture clock such that the first phase and second phase are sampled at substantially identical points on a phase axis associated with the analog signal.

10. The sampling circuit of claim 9, the tuned load capacitor comprising a variable capacitor.

11. The sampling circuit of claim 1, at least one of the first clock delay module or the second clock delay module further comprising:
at least one current-starved delay element; and
a tuned current source coupled to the current-starved delay element to provide a control current to control an amount of propagation delay associated with the current-starved delay element and to establish a position on a time axis of at least one of the first capture clock or the second capture clock such that the first phase and second phase are sampled at substantially identical points on a phase axis associated with the analog signal.

12. The sampling circuit of claim 11, the tuned current source comprising a variable current source.

13. A method of analog signal capture, comprising:
delaying a common clock by a first delay period to produce a first capture clock;
sampling a first phase of an analog signal by capturing a magnitude of the first phase upon receipt of a clock transition from the first capture clock;
delaying the common clock by a second delay period to produce a second capture clock; and
sampling a second phase of the analog signal by capturing a magnitude of the second phase upon receipt of a clock transition from the second capture clock.

14. The method of claim 13, further comprising:
establishing at least one of the first delay period or the second delay period such that the first and second capture clocks sample the first phase and the second phase at substantially identical points on a phase axis associated with the analog signal.

15. The method of claim 13, further comprising:
selecting a power supply voltage associated with a clock delay element;
adjusting at least one of the first delay period or the second delay period in proportion to the power supply voltage such that the first phase and the second phase are sampled at substantially identical points on a phase axis associated with the analog signal.

16. The method of claim 13, further comprising:
selecting a load capacitance associated with an output of a clock delay element;
adjusting at least one of the first delay period or the second delay period in proportion to the load capacitance such that the first phase and the second phase are sampled at substantially identical points on a phase axis associated with the analog signal using the first delay period and/or the second delay period.

17. The method of claim 13, further comprising:
selecting a magnitude of an electrical current supplied by a current source associated with a current-starved clock delay element;
adjusting at least one of the first delay period or the second delay period in proportion to the magnitude of the electrical current such that the first phase and the second phase are sampled at substantially identical points on a phase axis associated with the analog signal using the first delay period and/or the second delay period.

18. The method of claim 13, further comprising:
determining a phase difference between the first phase and the second phase;
determining a differential clock delay period proportional to the phase difference;
adjusting at least one of the first delay period or the second delay period in proportion to the differential clock delay period such that the first phase and the second phase are sampled at substantially identical points on a phase axis associated with the analog signal.

19. An analog signal sampling circuit, comprising:
a first track-and-hold circuit to capture a magnitude of a first phase of an analog signal upon receipt of a clock transition from a first capture clock;
at least one first inverter coupled to the first track-and-hold circuit to provide a first propagation delay to a common clock to produce the first capture clock;
a first power supply coupled to the first inverter to provide a first supply voltage to the first inverter to adjust a period of the first propagation delay in proportion to the first supply voltage;
a second track-and-hold circuit to capture a magnitude of a second phase of the analog signal upon receipt of a clock transition from a second capture clock;
at least one second inverter coupled to the second track-and-hold circuit to provide a second propagation delay to the common clock to produce the second capture clock;
a second power supply coupled to the second inverter to provide a second supply voltage to the second inverter to adjust a period of the second propagation delay in proportion to the second supply voltage;
a differential phase detector coupled to the first track-and-hold circuit and to the second track-and-hold circuit, the differential phase detector to determine a phase difference between the first phase and the second phase; and a delay control module coupled to the differential phase detector to act upon the first and second power supplies to adjust the first and second supply voltages to the first and second inverters in proportion to the phase difference such that the first phase and the second phase are sampled at substantially identical points on a phase axis associated with the analog signal.

* * * * *